United States Patent
Hsu et al.

(10) Patent No.: US 7,609,053 B2
(45) Date of Patent: Oct. 27, 2009

(54) WAFER TESTING SYSTEM INTEGRATED WITH RFID TECHNIQUES AND THESTING METHOD THEREOF

(75) Inventors: Wen Cheng Hsu, Hsinchu (TW); Min Ming Lo, Hsinchu (TW); Chao Chien Wang, Hsinchu (TW); Yi Fang Cho, Hsinchu (TW)

(73) Assignee: Chipmos Technologies Inc, Hsinchu (TW)

(*) Notice: Subject to any disclaimer, the term of this patent is extended or adjusted under 35 U.S.C. 154(b) by 0 days.

(21) Appl. No.: 12/061,781

(22) Filed: Apr. 3, 2008

(65) Prior Publication Data

US 2009/0237098 A1 Sep. 24, 2009

(30) Foreign Application Priority Data

Feb. 14, 2008 (TW) .............................. 97105113 A

(51) Int. Cl.
*G01R 31/28* (2006.01)
*G06F 17/00* (2006.01)
*G08B 13/14* (2006.01)
*G06F 7/00* (2006.01)

(52) U.S. Cl. ................. 324/158.1; 235/375; 340/572.1; 700/225

(58) Field of Classification Search ................. 700/225; 702/119

See application file for complete search history.

(56) References Cited

U.S. PATENT DOCUMENTS 6,236,223 B1 * 5/2001 Brady et al. ................. 324/765

6,330,971 B1 12/2001 Mabry et al.
2006/0043197 A1 3/2006 Chang et al.

FOREIGN PATENT DOCUMENTS

TW 267029 11/2006

* cited by examiner

*Primary Examiner*—Ha Tran T Nguyen
*Assistant Examiner*—Roberto Velez
(74) *Attorney, Agent, or Firm*—Ming Chow; Sinorica, LLC

(57) ABSTRACT

This invention provides a wafer testing system and testing method thereof. The wafer testing system comprises a wafer storage section, a prober, a tester, an RFID middleware unit, an EDA system and an MES system. The wafer storage section stores a multiplicity of carriers, each of which is provided with at least a RFID tag. The prober comprises a RFID reader to read a tag information. The tester sends a test signal to the prober for implementing the wafer test so as to generate a test result and calls an interface program to convert the test result into a file conformed with a specific data format. The RFID middleware unit receives the tag information and calls related applications to process the tag information so as to generate a wafer information. The EDA system receives the file of the specific data format converted from the interface program and calculates thereof to generate a wafer yield information after wafer test. The MES system integrates the wafer information from the RFID middleware unit with the yield information from the EDA system so as to allow monitoring the wafer manufacturing process and testing yield rate in a real-time manner.

15 Claims, 5 Drawing Sheets

WAFER TESTING SYSTEM INTEGRATED WITH RFID TECHNIQUES AND THE TESTING METHOD THEREOF

BACKGROUND OF THE INVENTION

1. Technical Field

The present invention relates to a wafer testing system and a testing method thereof. More particularly, the present invention relates to a wafer testing system integrated with radio frequency identification (RFID) techniques and a testing method thereof.

2. Description of Related Art

Prior art in relation to wafer inventory or transport using RFID techniques are disclosed in U.S. Pat. No. 6,330,971 (hereinafter referred to as '971), U.S. Patent Application Publication No. 20060043197 (hereinafter referred to as '197) and Taiwan Patent No. 1267029 (hereinafter referred to as '029). The '971 patent provides a wafer tracking system using RFID techniques, as shown in FIG. 1A, in which a system 10 comprises a plurality of wafer-loaded carriers 11, an RFID reader 12, an RFID tag 14 mounted on each of the carriers 11, and a controller 13. The RFID reader 12 reads the RFID tag 14 mounted on each of the carriers 11 through a plurality of antennas 15 connected thereto, and then sends a tag info read from the RFID tag 14 to the controller 13 via an RS-232 interface, thereby providing information regarding present locations of the carriers 11 and wafers loaded thereon.

The '197 patent application provides a wafer transport system using a carrier integrated with RFID techniques, as shown in FIG. 1B, in which a system 100 comprises a transport device 110, a carrier 111 for carrying wafers, a processing tool 115, an RFID reader 116 and a tool controller 117. When the carrier 111 is transported to the processing tool 115 by the transport device 110, the RFID reader 116 which is mounted at the processing tool 115 reads an RFID tag 114 mounted on a carrier body 112 of the carrier 111, and sends a carrier identification code stored in the RFID tag 114 to the tool controller 117 for the processing tool 115 to process wafers in the carrier 111.

The '029 patent provides a wafer transport system using a carrier integrated with RFID techniques, as shown in FIG. 1C, in which a transport system 1000 comprises a wafer cassette 1010, an RFID tag 1020 attached to the wafer cassette 1010, a transport device 1030, a processing tool 1040, an RFID reader 1050, a host 1060 and a trigger 1070. When the RFID tag 1020 of the wafer cassette 1010 appears in the vicinity of the processing tool 1040, an RFID interrogator can directly retrieve information from the RFID tag 1020 and automatically activate the transport device 1030. As a result, the wafer cassette 1010 may be mistakenly transported to a port by a mechanical arm, thereby injuring an operator. However, the operator can give instructions to the host 1060 by directly operating the trigger 1070, so as to control the timing of information retrieval by the RFID interrogator. Therefore, the mechanical arm will not be accidentally activated by untimely retrieval of information from the RFID tag 1020 by the RFID interrogator, and the operator's safety is thus secured.

While the prior art mentioned above uses RFID techniques to transport or track wafers, the RFID techniques are not effectively integrated with an engineering data analysis (EDA) system employed to analyze data regarding a wafer testing process. As a result, a wafer-based manufacturing process and yield cannot be monitored in real time by the EDA system, the operator, the manufacturing system or even the customer who ordered the manufacture. Therefore, it is a pressing issue in relevant industries to integrate RFID techniques into a wafer testing system, so that wafer test results as well as the transport and tracking of wafer inventory can be monitored on-line via the EDA system.

SUMMARY OF THE INVENTION

In order to monitor a wafer-base manufacturing process and yield in a real-time manner and thereby make up for the shortcomings of prior art, the present invention provides a wafer testing system integrated with RFID techniques and a testing method thereof, wherein the wafer testing system comprises a wafer storage section, a prober, a tester, an RFID middleware unit, an EDA system and a manufacturing execution system (MES system). The wafer storage section stores a plurality of carriers, each of which is loaded with at least one wafer and provided with an RFID tag. The prober is provided with an RFID reader for reading a tag info stored in the RFID tag. The RFID middleware unit receives the tag info and calls related applications to process the tag info so as to generate a corresponding wafer info. The EDA system receives and processes a file in a specific data format converted by an interface program to generate a yield info after the wafer testing process. The MES system integrates the wafer info from the RFID middleware unit with the yield info from the EDA system, so that a wafer-base manufacturing process and yield can be monitored in real time.

Therefore, a primary objective of the present invention is to provide a wafer testing system integrated with RFID techniques and a testing method thereof, wherein the RFID techniques are integrated into an EDA system employed to analyze data regarding the wafer testing process, so that wafer test results can be sent directly to the EDA system to allow a real-time monitoring process of a yield info after the wafer testing process.

A second objective of the present invention is to provide a wafer testing system integrated with RFID techniques and a testing method thereof, wherein a prober is further equipped with an RFID reader for reading via radio frequency a tag info stored in an RFID tag attached to a carrier, so that a wafer lot info of the carrier can be monitored in real time by the system or an operator.

A third objective of the present invention is to provide a wafer testing system integrated with RFID techniques and a testing method thereof, wherein an RFID middleware unit is provided to receive a tag info read by an RFID reader and call related applications to process the tag info so as to generate a wafer info.

A fourth objective of the present invention is to provide a wafer testing system integrated with RFID techniques and a testing method thereof, wherein a tester is provided for sending a test signal to a prober so as to conduct a testing process on a wafer and, when the test is completed, calling an interface program to convert a wafer test result into a file conforming to a specific data format.

A fifth objective of the present invention is to provide a wafer testing system integrated with RFID techniques and a testing method thereof, wherein an MES system is provided to integrate a wafer info from an RFID middleware unit with a yield info from an EDA system, so that a wafer-based manufacturing process and yield can be monitored in real time by the system or an operator.

A sixth objective of the present invention is to provide a wafer testing system integrated with RFID techniques and a testing method thereof, wherein an interface is provided for data interconnection between an EDA system and an MES system.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

The present invention provides a wafer testing system integrated with RFID techniques and a testing method thereof that allow a real-time monitoring process of a wafer-based manufacturing process and yield. Now that a person of ordinary skill in the art would readily understand the wafer testing procedure and the theory of radio frequency identification involved in the present invention, a complete description thereof will not be given herein. Besides, drawings referred to in the following description are not drawn according to actual dimension and it is not necessary to do so because the drawings are intended to only schematically demonstrate structures related to features of the present invention.

Figure 1A:
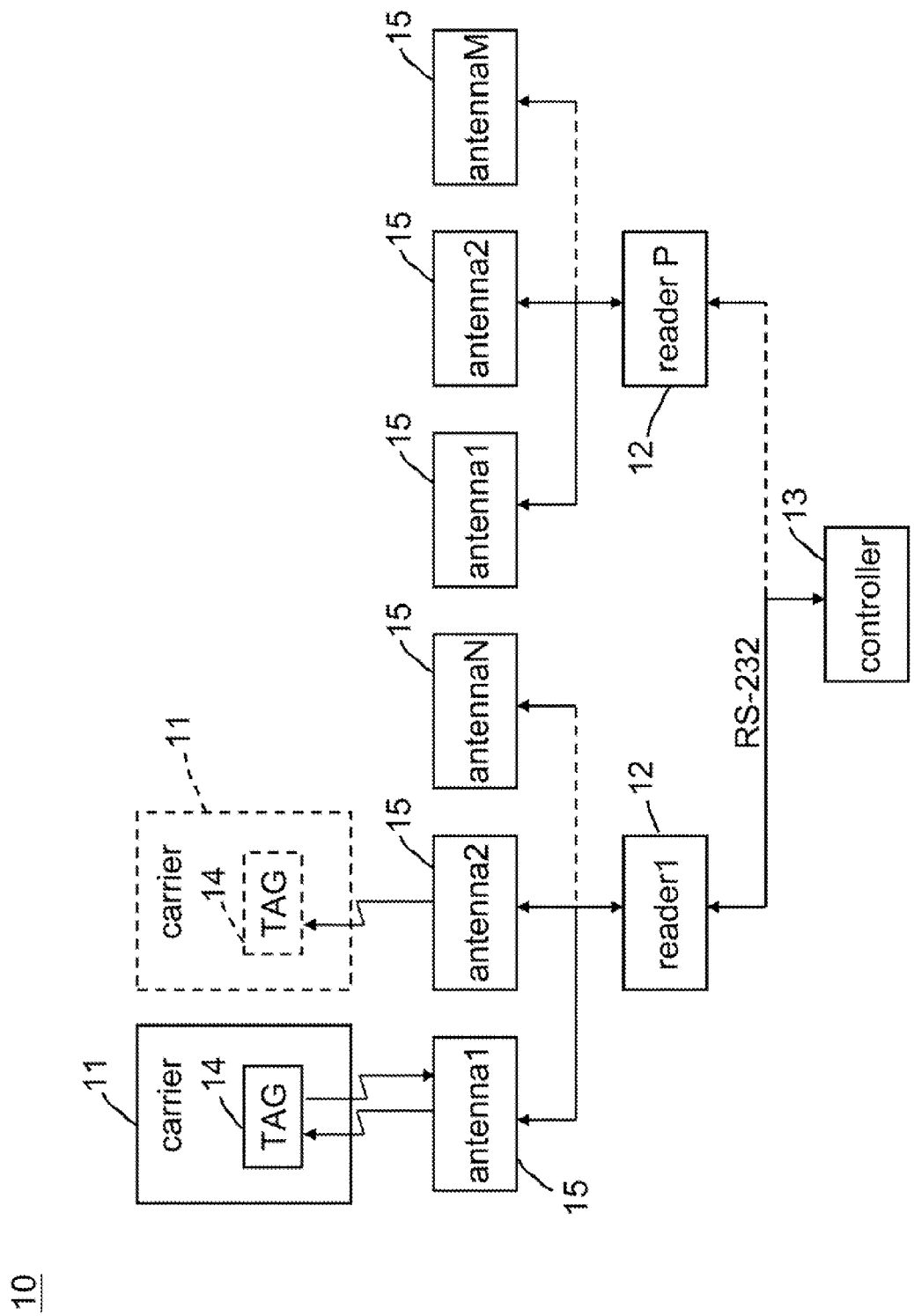
FIGS. 1A to 1C are block diagrams showing wafer systems integrated with RFID techniques according to some prior arts.
Figure 1B:
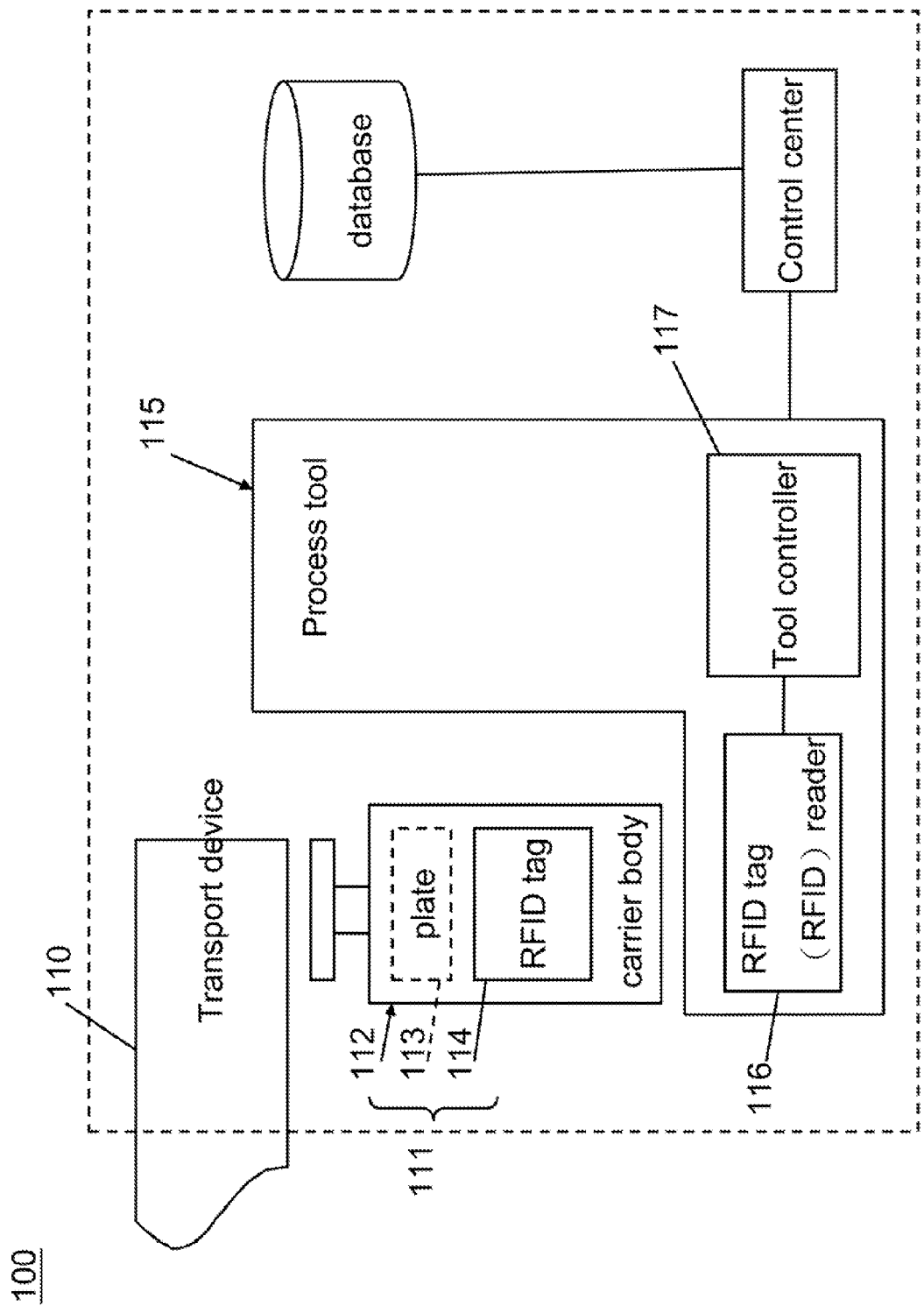
Figure 1C:
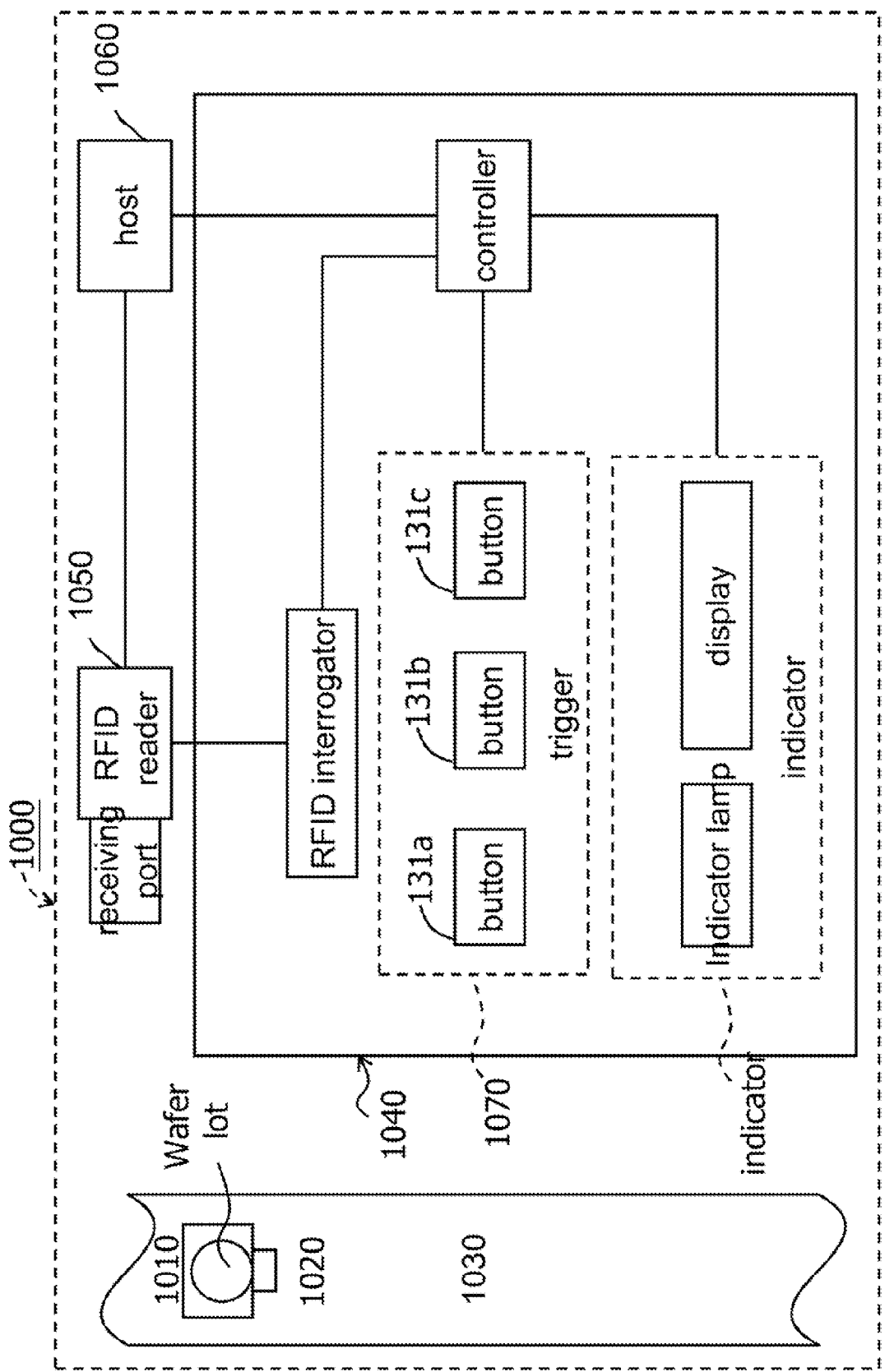
Figure 2:
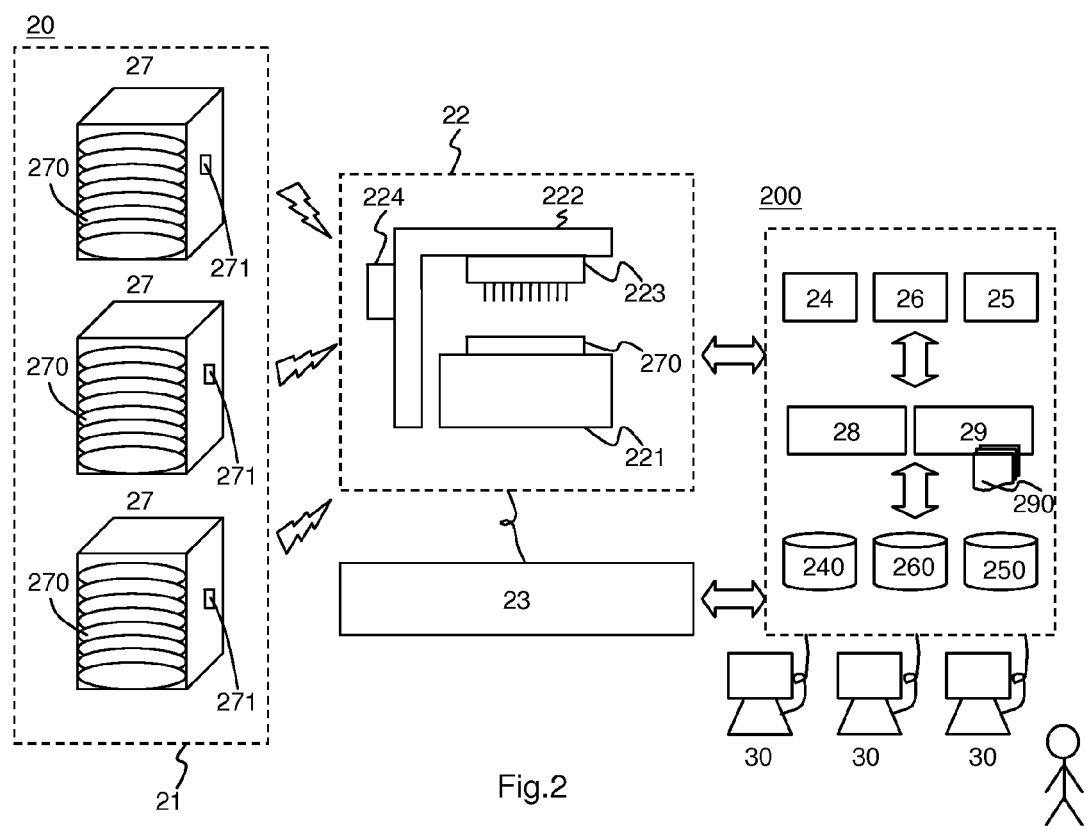
FIG. 2 is a block diagram of a wafer testing system integrated with RFID techniques according to a preferred embodiment of the present invention.
Figure 3:
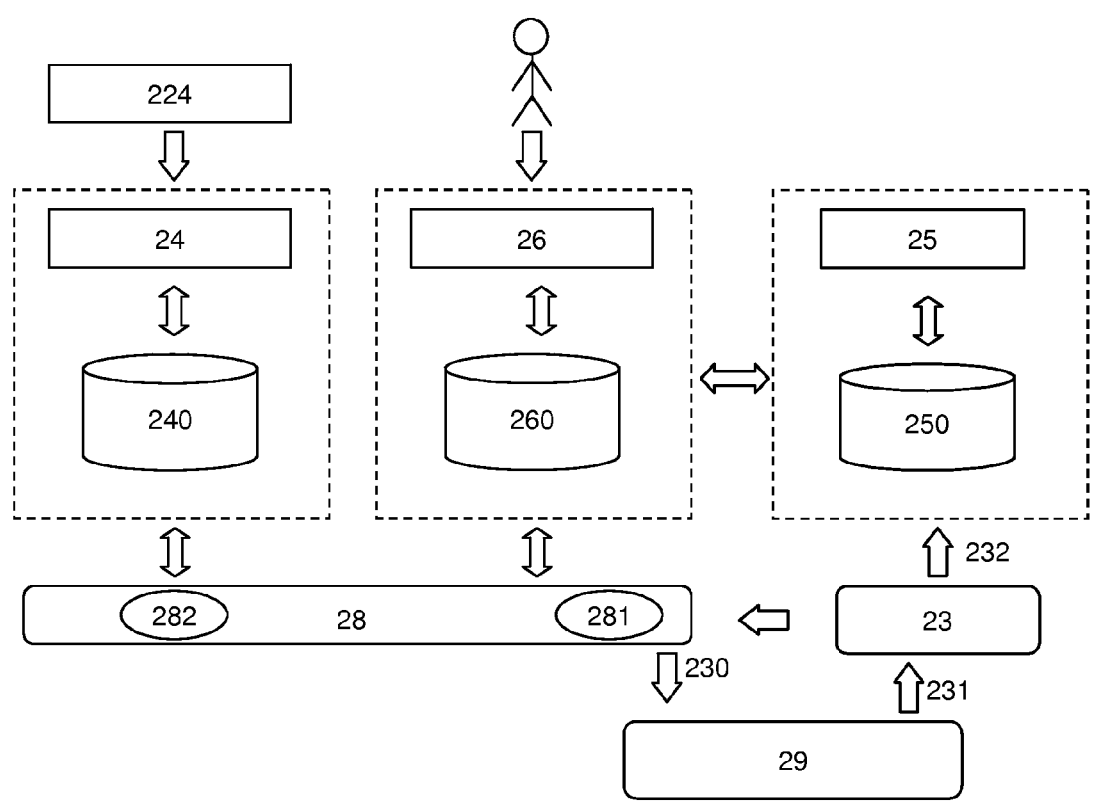
FIG. 3 is a block diagram showing an IT platform structure according to the wafer testing system integrated with RFID techniques shown in FIG. 2.

Referring to FIGS. 2 and 3, a wafer testing system 20 integrated with RFID techniques according to a preferred embodiment of the present invention comprises a wafer storage section 21, a prober 22, a tester 23 and a backend IT platform 200, wherein the backend IT platform 200 comprises an RFID middleware unit 24, an EDA system 25 and an MES system 26. The wafer storage section 21 stores a plurality of carriers 27, each of which is loaded with at least one wafer 270 and provided with at least one RFID tag 271. The prober 22 conducts a wafer testing process and comprises a movable stage 221, a probe card clamping mechanism 222 and a probe card 223 clamped by the probe card clamping mechanism 222. The movable stage 221 is used to support the wafer 270 to be tested by the probe card 223 and move the wafer 270 to be tested along X, Y and Z axes (not shown). The prober 22 further comprises an RFID reader 224 for reading via radio frequency a tag info stored in the RFID tag 271 attached to each of the carriers 27, wherein the tag info comprises such information as a tag ID, a carrier ID, a customer ID, a wafer ID and a probe card ID. Based on the tag info, the tester 23 sends to the prober 22 a test signal corresponding to the wafer to be tested so as to actuate the wafer testing process. When the testing process is completed, the tester 23 calls an interface program 281 stored in an application program server 28 to convert a test result 231 of the wafer into a file 232 conforming to a specific data format, which is in accordance with an XML format or some other data exchange standards suitable for the industry. The RFID middleware unit 24 receives the tag info read by the RFID reader 224 and calls another application program 282 in the application program server 28 to process the tag info so as to generate a wafer info. The EDA system receives and processes the file in the specific data format converted by the interface program 281 to generate a yield info of the wafer. The MES system 26 integrates the wafer info from the RFID middleware unit 24 with the yield info from the EDA system 25, so that a wafer-base manufacturing process and yield can be monitored in real time by the system or the operator.

In this embodiment, the operator can monitor the test results of the wafers in a real-time manner via an output device 30, which can be a browser-based PC workstation. Furthermore, customers who ordered the wafer tests may also, after being authorized, monitor the test results of the wafers in a real-time manner via a similar output device, in order to timely adjust parameters in the wafer manufacturing process.

The RFID middleware unit 24 further comprises a middleware database 240 for storing data related to the tag info of the wafer to be tested. The EDA system 25 further comprises an EDA database 250 for storing data related to a wafer test yield. The MES system 26 further comprises an MES database 260 for storing data related to the wafer testing process and processing methods. In addition, the backend IT platform 200 further comprises a file server 29 for storing a setup file 290 related to wafer test parameters. The setup file 290 is generated according to the tag info of the wafer to be tested, by integrating the data stored in the middleware database 240 and in the MES database 260. In other words, data interconnection is carried out between the EDA database 250 and the MES database 260, so that the tester 23 can conduct relevant tests on the wafer to be tested after receiving the setup file 290 of that wafer. The aforementioned application program server 28 stores application programs related to the middleware database 240, the MES database 260 or the file server 29. Furthermore, the aforementioned RFID tag 271 can be passive or active. Still further, the carriers 27 can be one of cassettes, front-opening unified pods (FOUPs), and front-opening shipping boxes (FOSB). Moreover, the aforementioned tag info can further comprise a number of good dies on each of the wafers.

In addition, based on the foregoing wafer testing system 20 integrated with RFID techniques, the present invention provides as another preferred embodiment a wafer testing method integrated with RFID techniques, which method comprises steps of:

(1) providing a wafer storage section for storing a plurality of carriers, each of which is loaded with a plurality of wafers and provided with at least one RFID tag;

(2) providing a prober which comprises a movable stage, a probe card clamping mechanism and a probe card, wherein the movable stage is used to support a wafer to be tested and move the wafer along X, Y and Z axes while the probe card is clamped by the probe card clamping mechanism;

(3) providing a tester for sending a test signal to the prober to actuate a wafer testing process and, when testing is completed, calling an interface program to convert a test result of the wafer into a file conforming to a specific data format;

(4) further providing the prober with at least an RFID reader for reading via radio frequency a tag info in the RFID tag;

(5) providing an RFID middleware unit for receiving the tag info read by the RFID reader and calling related applications to process said tag info so as to generate a wafer info;

(6) providing an EDA system for receiving and processing the file in the specific data format converted by the interface program to generate a wafer yield info; and (7) providing an MES system for integrating the wafer info from the RFID middleware unit with the yield info from the EDA system, so that the system or an operator can monitor a wafer-base manufacturing process and yield in real time.

The present invention has been described with reference to preferred embodiments thereof, which are not intended to limit the scope of the present invention. Moreover, the content disclosed herein may be readily understood and carried out by a person skilled in the art. Therefore, all equivalent changes or modifications should be encompassed by the appended claims provided such changes or modifications do not depart from the spirit of the present invention.

What is claimed is:

1. A wafer testing system integrated with radio frequency identification (RFID) techniques, comprising:
   a wafer storage section, for storing at least a carrier loaded with a plurality of wafers;
   a prober, comprising a movable stage, a probe card clamping mechanism and a probe card, wherein the movable stage is used to support a wafer to be tested and move the wafer along X, Y and Z axes while the probe card is clamped by the probe card clamping mechanism; and
   a tester, for sending a test signal to the prober so as to conduct a testing process on said wafer and, when the testing process is completed, calling an interface program to convert a test result of said wafer into a file conforming to a specific data format;
   wherein the wafer testing system is characterized in:
   the carrier being provided with at least one RFID tag;
   the prober being provided with an RFID reader for reading a tag info stored in the RFID tag;
   an RFID middleware unit being provided to receive the tag info read by the RFID reader and calling related applications so as to generate a corresponding wafer info;
   an engineering data analysis (EDA) system being provided to receive and process the file in the specific data format converted by the interface program so as to generate a yield info of said wafer; and
   a manufacturing execution system (MES system) being provided to integrate the wafer info from the RFID middleware unit with the yield info from the EDA system to allow a real-time wafer-based monitoring process.

2. The wafer testing system as claimed in claim 1, wherein the tag info comprises at least one selected from the group consisting of a tag ID, a carrier ID, a customer ID, a wafer ID and a probe card ID, and a combination thereof.

3. The wafer testing system as claimed in claim 1, wherein the tag info further comprises a number of good dies on each of the wafers.

4. The wafer testing system as claimed in claim 1, wherein the RFID tag is passive or active.

5. The wafer testing system as claimed in claim 1, wherein the RFID middleware unit further comprises a middleware database for storing data related to the tag info.

6. The wafer testing system as claimed in claim 1, wherein the EDA system further comprises an EDA database for storing data related to a wafer test yield.

7. The wafer testing system as claimed in claim 1, wherein the MES system further comprises an MES database for storing data related to the wafer testing process.

8. The wafer testing system as claimed in claim 1, further comprising a file server for storing at least a setup file related to wafer test parameters.

9. The wafer testing system as claimed in claim 8, wherein the setup file is generated by integrating the data stored in the middleware database and in the MES database, and is inputted to the tester so as to conduct the wafer test.

10. The wafer testing system as claimed in claim 8, further comprising an application program server for storing application programs related to the middleware database, the MES database or the file server.

11. The wafer testing system as claimed in claim 1, further comprising an output device for a real-time monitoring process.

12. The wafer testing system as claimed in claim 1, wherein the carrier is selected from the group consisting of a cassette, a front-opening unified pod (FOUP) and a front-opening shipping box (FOSB).

13. The wafer testing system as claimed in claim 1, wherein the file in the specific data format conforms to an extensible markup language (XML) format.

14. The wafer testing system as claimed in claim 1, wherein the output device is a browser-based PC workstation.

15. A wafer testing method integrated with RFID techniques, comprising steps of:
   providing a wafer storage section for storing a carrier loaded with a plurality of wafers;
   providing a prober which comprises a movable stage, a probe card clamping mechanism and a probe card, wherein the movable stage is used to support a wafer to be tested and move the wafer along X, Y and Z axes while the probe card is clamped by the probe card clamping mechanism; and
   providing a tester for sending a test signal to the prober so as to conduct a test on said wafer and, when the test is completed, calling an interface program to convert a test result of said wafer into a file conforming to a specific data format;
   wherein the method is characterized in further comprising steps of:
   providing the carrier with at least one RFID tag;
   providing the prober with an RFID reader for reading a tag info stored in the RFID tag;
   providing an RFID middleware unit for receiving the tag info read by the RFID reader and calling related applications so as to generate a corresponding wafer info;
   providing an EDA system for receiving and processing the file in the specific data format converted by the interface program so as to generate a yield info of said wafer; and
   providing an MES system for integrating the wafer info from the RFID middleware unit with the yield info from the EDA system to allow a real-time wafer-based monitoring process.

* * * * *